United States Patent
Puri et al.

(10) Patent No.: US 9,748,180 B2
(45) Date of Patent: Aug. 29, 2017

(54) THROUGH-BODY VIA LINER DEPOSITION

(71) Applicant: INTEL CORPORATION, Santa Clara, CA (US)

(72) Inventors: Puneesh Puri, Bengaluru (IN); Jiho Kang, Portland, OR (US); James Y. Jeong, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/124,820

(22) PCT Filed: Jul. 8, 2014

(86) PCT No.: PCT/US2014/045781
§ 371 (c)(1),
(2) Date: Sep. 9, 2016

(87) PCT Pub. No.: WO2016/007141
PCT Pub. Date: Jan. 14, 2016

(65) Prior Publication Data
US 2017/0018509 A1   Jan. 19, 2017

(51) Int. Cl.
H01L 29/00 (2006.01)
H01L 23/00 (2006.01)
(Continued)

(52) U.S. Cl.
CPC ...... *H01L 23/562* (2013.01); *H01L 21/76224* (2013.01); *H01L 21/76229* (2013.01);
(Continued)

(58) Field of Classification Search
CPC ........... H01L 21/76224; H01L 29/0649; H01L 21/76229; H01L 21/76831; H01L 21/76832
See application file for complete search history.

(56) References Cited

U.S. PATENT DOCUMENTS 6,437,385 B1 * 8/2002 Bertin ............... H01L 27/10861
257/301
9,418,939 B2 * 8/2016 Wu
(Continued)

FOREIGN PATENT DOCUMENTS

WO      2016007141 A1    1/2016

OTHER PUBLICATIONS

International Search Report and Written Opinion received for PCT Application No. PCT/US2014/045781. Mail date: Mar. 31, 2015. 12 pages.
(Continued)

*Primary Examiner* — Ngan Ngo
(74) *Attorney, Agent, or Firm* — Finch & Maloney PLLC

(57) ABSTRACT

Techniques are disclosed for through-body via liner structures and processes of forming such liner structures in an integrated circuit. In an embodiment, an integrated circuit includes a silicon semiconductor substrate having one or more through-silicon vias (TSVs), although other through-body vias can be used as will be appreciated in light of this disclosure. Each TSV extends through at least a portion of the substrate, for example, from one side (e.g., top) of the substrate to the opposite side of the substrate (e.g., bottom), or from one internal layer of the substrate to another internal layer. A liner is disposed between the substrate and each TSV. The liner is formed of multiple alternating layers of dissimilar insulation films (e.g., tensile films and compressive films) sandwiched together.

25 Claims, 5 Drawing Sheets

(51) Int. Cl.
*H01L 21/762* (2006.01)
*H01L 29/06* (2006.01)
*H01L 23/48* (2006.01)
*H01L 21/768* (2006.01)
*H01L 23/532* (2006.01)

(52) U.S. Cl.
CPC .. *H01L 21/76831* (2013.01); *H01L 21/76832* (2013.01); *H01L 21/76897* (2013.01); *H01L 23/481* (2013.01); *H01L 23/53238* (2013.01); *H01L 23/53295* (2013.01); *H01L 24/05* (2013.01); *H01L 29/0649* (2013.01); *H01L 2224/05025* (2013.01); *H01L 2924/0002* (2013.01)

(56) References Cited

U.S. PATENT DOCUMENTS

| | | |
|---|---|---|
| 2009/0191708 A1 | 7/2009 | Kropewnicki et al. |
| 2010/0140684 A1* | 6/2010 | Ozawa .............. H01L 21/28282 257/324 |
| 2011/0169140 A1 | 7/2011 | Moroz |
| 2013/0049127 A1 | 2/2013 | Chen et al. |
| 2013/0056820 A1* | 3/2013 | Jeong .................... H01L 27/0688 257/324 |
| 2013/0249011 A1 | 9/2013 | Choi et al. |
| 2014/0001544 A1* | 1/2014 | Sato .................. H01L 29/66833 257/330 |
| 2014/0015146 A1 | 1/2014 | Yu et al. |
| 2014/0027835 A1* | 1/2014 | Tanaka .................. H01L 29/792 257/324 |
| 2014/0332919 A1* | 11/2014 | Guan .................... H01L 29/404 257/487 |
| 2014/0346585 A1* | 11/2014 | Kuge ................ H01L 27/11582 257/324 |
| 2016/0133568 A1* | 5/2016 | Wu ....................... H01L 23/535 257/314 |

OTHER PUBLICATIONS

International Preliminary Report on Patentability as received for Patent Application No. PCT/US2014/045781, issued on Jan. 10, 2017. 8 pages.

* cited by examiner

THROUGH-BODY VIA LINER DEPOSITION

FIELD OF THE DISCLOSURE

The present disclosure relates to integrated circuits, and more particularly, to liners for through-silicon vias or other through-body via structures.

BACKGROUND

A through-silicon via (TSV) is an electrically conductive connection that passes through a silicon substrate. TSV interconnections can be used with three-dimensional system-in-packaging (3D-SiP) technology, which permits short connection distances and fast speeds between devices. TSVs can be formed by depositing a conductive material, such as copper, into openings etched in the substrate. A non-conductive layer between the silicon and the conductive material, also referred to as a TSV liner, serves as an insulator. The aspect ratio of the TSV opening (i.e., height to width) is often high, e.g., 12:1, increasing the difficulty of forming the liner. The liner deposition process on a chemical vapor deposition (CVD) platform involves deposition of a tensile thermal film followed by plasma assisted hermetic compressive oxide film as a cap.

DETAILED DESCRIPTION

Techniques are disclosed for through-body via liner structures and processes of forming such liner structures in an integrated circuit. In an embodiment, an integrated circuit includes a silicon semiconductor substrate having one or more through-silicon vias (TSVs), although other through-body vias can be used as will be appreciated in light of this disclosure. Each TSV extends through at least a portion of the substrate, for example, from one side (e.g., top) of the substrate to the opposite side of the substrate (e.g., bottom), or from one internal layer of the substrate to another internal layer. A liner is disposed between the substrate and each TSV. The liner is formed of multiple alternating layers of dissimilar insulation films (e.g., tensile films and compressive films) sandwiched together. For example, the liner can be formed by depositing two or more 0.5× thickness thermal layers and two or more 0.5× thickness compressive layers in alternating succession. As will be further appreciated in light of this disclosure, by using an approach in which the tensile and compressive films are alternately deposited, stress can be relieved in the liner, which reduces or eliminates defects such as cracks or seams at the bottom corner of the via. The techniques can be embodied, for example, in discrete memory devices (e.g., non-volatile and volatile memory chips), integrated system designs (e.g., purpose-built silicon), or on-chip memory (e.g., microprocessor with on-chip non-volatile cache), to name a few. Numerous other embodiments, variations, and applications will be apparent in light of this disclosure.

General Overview

Figure 1A:
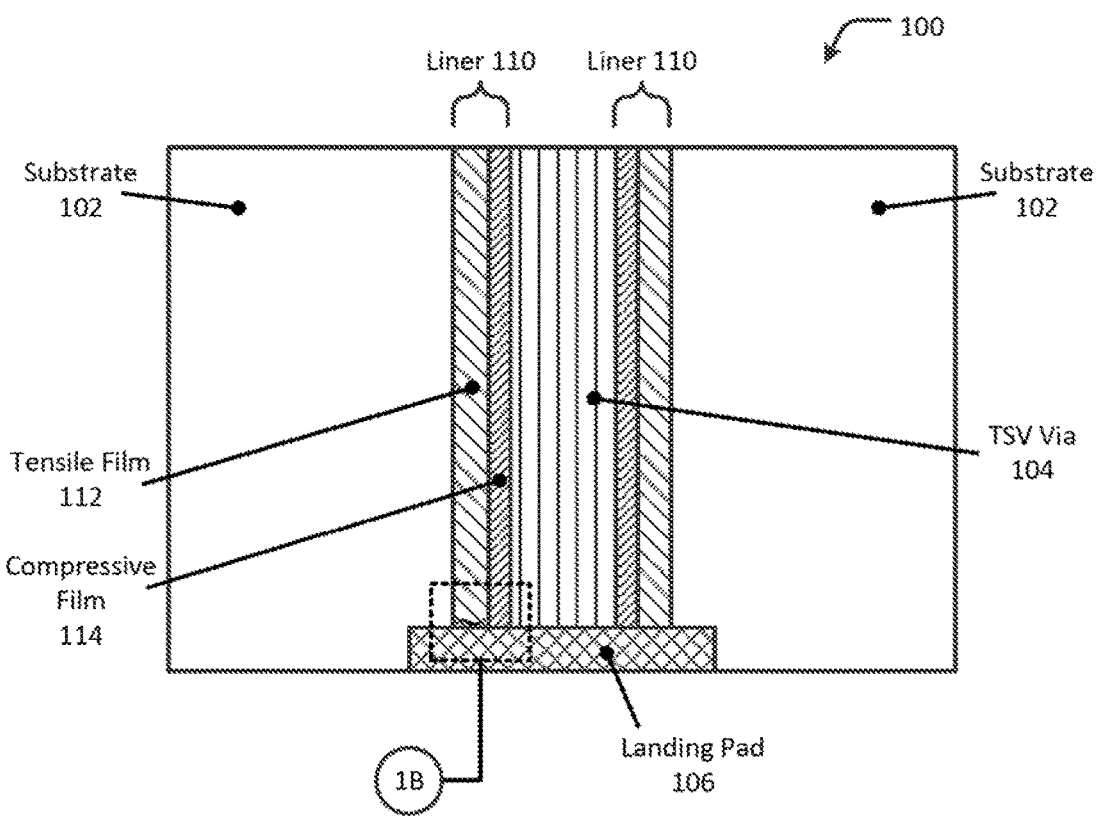
FIG. 1A illustrates a partial cross-section of a typical TSV structure.
Figure 1B:
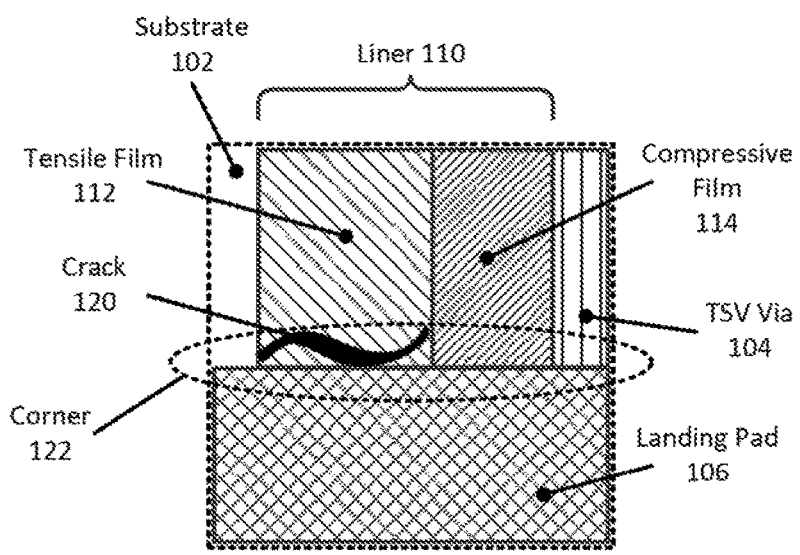
FIG. 1B illustrates a detailed view of a portion of the TSV structure of FIG. 1A.

Typically, during the manufacturing process of an integrated circuit (IC) having a TSV interconnection, a TSV liner is deposited after the via has been etched into the silicon substrate to electrically insulate the conductor in the via from the silicon. As noted above, the liner deposition process on a chemical vapor deposition (CVD) platform can involve deposition of a tensile thermal film followed by plasma assisted hermetic compressive oxide film as a cap. This approach can lead to cracks or seams between the TSV and the bottom corner of the via due to stress mismatch and inherent tensile stress in the thermal film caused by a high deposition rate or a high thickness of the liner. The cracks or seams can provide a leakage path, and become worse during the annealing process, potentially leading to two-to-three orders of magnitude increase in leakage. In more detail, FIG. 1A shows a partial cross-section of an IC 100 in which a substrate 102 is insulated from a via 104 by a liner 110 having a tensile film layer 112 and a compressive film layer 114. FIG. 1B is a detailed view of a portion of the IC 100 where the liner 110 is landed on a landing pad 106. The tensile film 112, when deposited in the manner illustrated in FIGS. 1A and 1B, can develop a crack 120 or seam at the corner 122 of the via 104 and the substrate 102 due to inherent stress in the liner 110 caused by a high deposition rate or the thickness of the liner. This crack 120 or seam can provide an undesirable leakage path between the via 104 and the substrate 102.

Thus, and in accordance with an embodiment of the present disclosure, a TSV liner structure and TSV liner deposition process that can reduce such leakage paths for meeting the functional specifications of the IC using a sandwich approach in which the tensile and compressive films are deposited alternately. By implementing the TSV liner layers in alternating fashion, particularly where each layer is deposited in thin layers, the stress in the liner can be relieved. Use of the disclosed structures and techniques can be identified cross-sectionally with imaging techniques (e.g., transmission electron microscopy or TEM) of a given integrated circuit or other device that has a liner structure that uses alternating layers of dissimilar structures, as variously described in this disclosure. For example, using TEM imaging, there will be observable differences in density, refractive index, modulus/hardness, and dielectric constant between a thermal dielectric film layer and a plasma-enhanced chemical vapor deposition (PECVD) dielectric film layer.

Numerous embodiments and configurations that use a TSV liner having alternating layers can be realized by, for example, changing the number of layers (e.g., four, six, etc.) depending on the desired total thickness of the liner so as to keep the individual layers thin enough to avoid stress-induced cracks or seams in the liner. The structures and techniques described herein can be used in numerous applications, such as discrete memory devices as well as in microprocessors or other on-chip applications. Other suitable applications will be apparent in light of this disclosure. It will be further understood that the techniques described herein can be used with any type of through-body via structure and are not limited to silicon.

Example Structures

Figure 2:
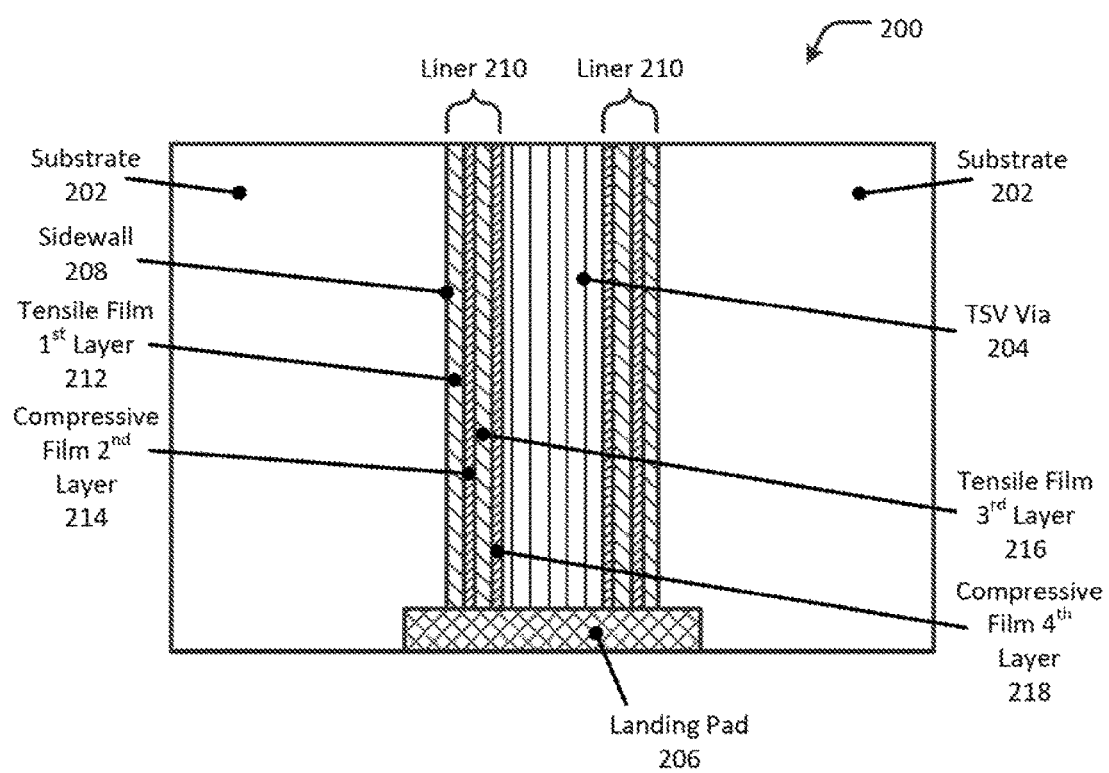
FIG. 2 illustrates a cross-section of a portion of a TSV structure configured in accordance with an embodiment of the present disclosure.

FIG. 2 illustrates a cross-section of a portion of an integrated circuit (IC) 200 configured in accordance with an embodiment of the present disclosure. The IC 200 includes a substrate 202 and a TSV 204 extending through the substrate 202. The TSV 204 can be filled with a conductive material, such as copper. Although only one TSV is depicted in FIG. 2, it will be understood that the IC 200 can be configured to have any number of TSVs. The IC 200 may, in some embodiments, include a landing pad 206 or other surface disposed at one or both ends of the TSV 204, depending on the particular application. One or more TSV liners 210 are disposed between a sidewall of the substrate 202 and the via 204. In embodiments having the landing pad 206, a portion of the TSV liner 210 abuts the landing pad 206, as shown in FIG. 2.

The TSV liner 210 can be fabricated of materials that electrically insulate the conductive material in the via 204 from the substrate 202. In some embodiments, the TSV liner 210 includes alternating layers of dielectric film layers formed using different deposition materials or methods. For example, the dielectric film layers may be formed using one or more types of oxide, nitride and carbide films, such as silicon oxide, silicon nitride, silicon carbide, carbon doped oxide (CDO), oxide doped carbide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide, or other dielectric films that can conform to large or the otherwise given aspect ratios. In this example embodiment, the TSV liner 210 includes a first insulation layer 212, a second insulation layer 214, a third insulation layer 216, and a fourth insulation layer 218. The first and third insulation layers 212, 216 are oxide, nitride or carbide films (or other suitable insulator materials) having an inherent tensile stress, and the second and fourth insulation layers 214, 218 are oxide, nitride or carbide films (or other suitable insulator materials) having an inherent compressive stress. The TSV liner 210 can be formed by a variety of deposition techniques. The stress of the films in any layer can be modulated by process parameters during deposition. Furthermore, it will be understood in light of this disclosure that in some other embodiments, the first and third insulation layers 212, 216 can be films having an inherent compressive stress, and the second and fourth insulation layers 214, 218 can be films having an inherent tensile stress. In some embodiments, the deposition of the first and third insulation layers 212, 216 can be carried out using a thermal oxidation process, and the deposition of the second and fourth insulation layers 214, 218 can be carried out using a plasma-enhanced chemical vapor deposition (PECVD) process. Thus, the first and third insulation layers 212, 216 can have different structural properties than the second and fourth insulation layers 214, 218. For example, in the case of PECVD, the stress of each layer can be changed from compressive to tensile or from tensile to compressive by modulating high and low frequency power from generators. In another example, in the case of both PECVD and thermal films, the stress of each layer can be changed from compressive to tensile or from tensile to compressive by modulating the ratio of materials in the insulator compound, such as in the case of Si to N (for silicon nitride films) or Si to O (for silicon dioxide films).

Several example embodiments are listed below, each listing four layers in order from first to fourth insulation layers 212, 214, 216 and 218:

Tensile oxide, compressive oxide, tensile oxide, compressive oxide

Tensile oxide, compressive nitride, tensile oxide, compressive nitride

Compressive oxide, tensile oxide, compressive oxide, tensile oxide

Compressive nitride, tensile oxide, compressive nitride, tensile oxide

Figure 3:
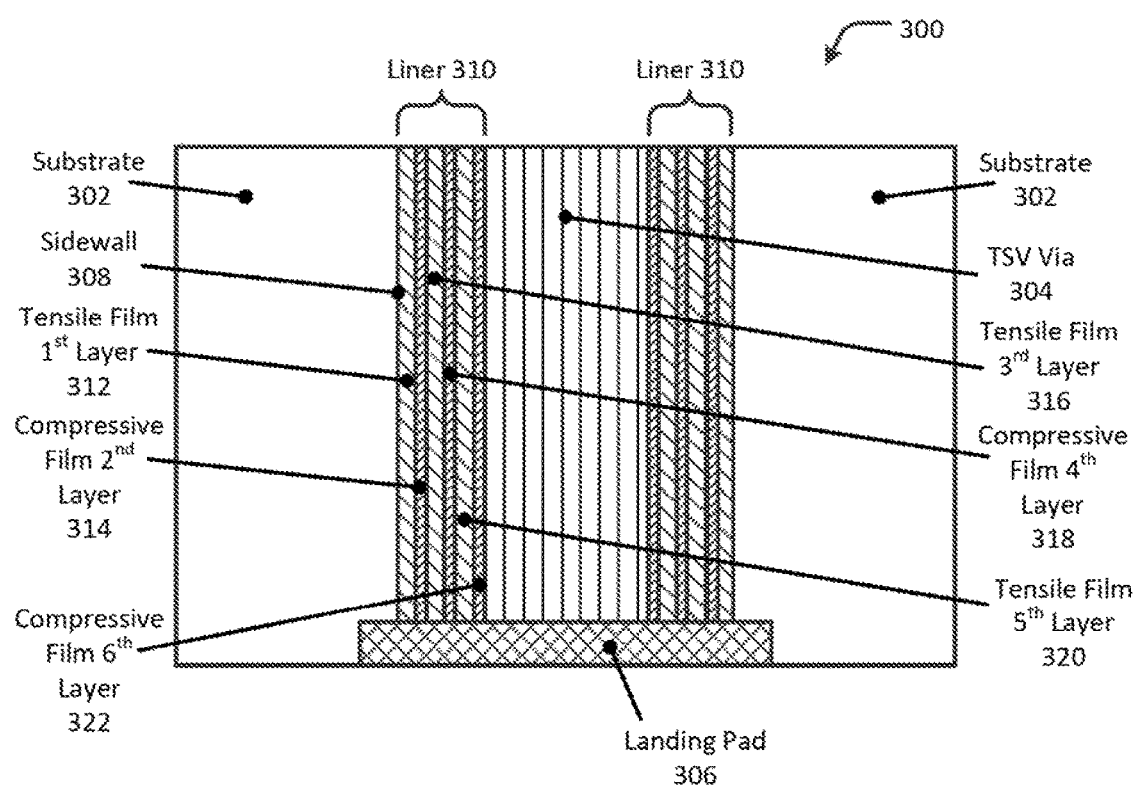
FIG. 3 illustrates a cross-section of a portion of a TSV structure configured in accordance with an embodiment of the present disclosure.

Example processes for forming these structures will be discussed with reference to FIG. 4. FIG. 3 illustrates a cross-section of a portion of an IC 300 configured in accordance with another embodiment of the present disclosure. The IC 300 includes a substrate 302 and a TSV 304 extending through the substrate 302. The TSV 304 can be filled with a conductive material, such as copper. Although only one TSV is depicted in FIG. 3, it will be understood that the IC 300 can be configured to have any number of TSVs. The IC 300 may, in some embodiments, include a landing pad 306 or other surface disposed at one or both ends of the TSV 304, depending on the particular application. One or more TSV liners 310 are disposed between a sidewall of the substrate 302 and the via 304. In embodiments having the landing pad 306, a portion of the TSV liner 210 abuts the landing pad 306, as shown in FIG. 3.

The TSV liner 310 can be fabricated of materials that electrically insulate the conductive material in the via 204 from the substrate 302. In some embodiments, the TSV liner 310 includes alternating layers of dielectric film layers formed using different deposition materials or methods. For example, the dielectric film layers may be formed using one or more types of oxide, nitride and carbide films, such as silicon oxide, silicon nitride, or other dielectric films that can conform to large aspect ratios, as previously explained. In this example embodiment, the TSV liner 310 includes a first insulation layer 312, a second insulation layer 314, a third insulation layer 316, a fourth insulation layer 318, a fifth insulation layer 320, and a sixth insulation layer 322. The first, third and fifth insulation layers 312, 316, 320 can include, for example, an oxide or nitride or other insulator film having an inherent tensile stress (e.g., silicon dioxide), and the second, fourth and sixth insulation layers 314, 318, 322 can include an oxide or nitride or other insulator film having an inherent compressive stress (e.g., silicon nitride). The TSV liner 310 can be formed by a variety of deposition techniques. In some embodiments, the deposition of the first, third and fifth insulation layers 312, 316, 320 can be carried out using a thermal oxidation process, and the deposition of the second, fourth and sixth insulation layers 314, 318, 322 can be carried out using a plasma-enhanced chemical vapor deposition (PECVD) process. Thus, the first, third and fifth insulation layers 312, 316, 320 can have different structural properties than the second, fourth and sixth insulation layers 314, 318, 322. Example processes for forming these structures will be discussed with reference to FIG. 4.

It will be appreciated in light of this disclosure that other embodiments of TSV liners can be fabricated with any number of insulation layers in arrangements similar to those described in this disclosure.

Example Methodology

Figure 4:
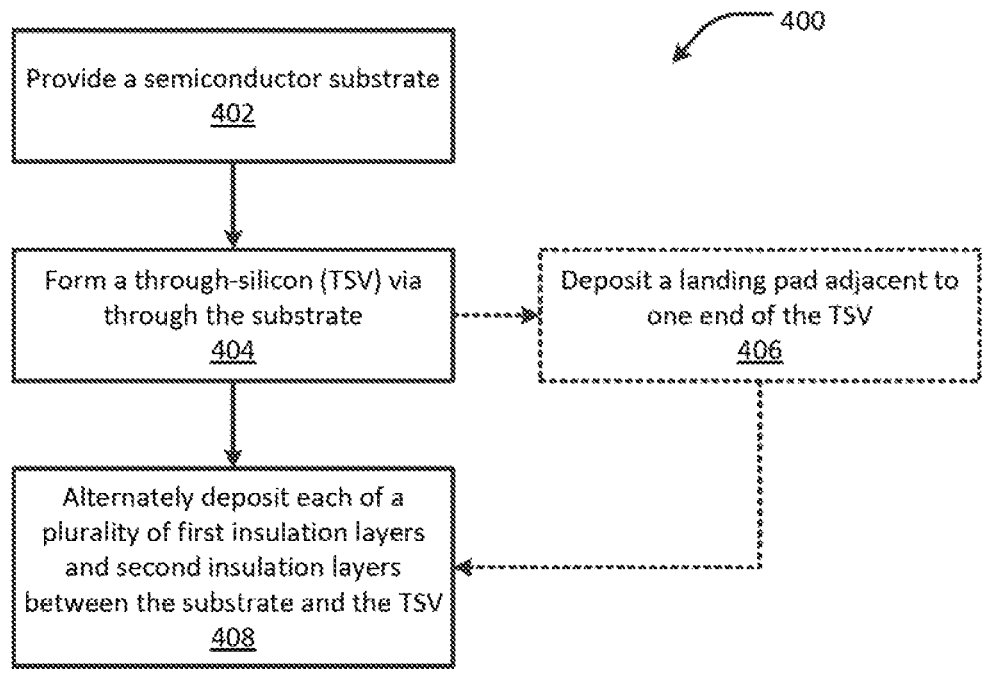
FIG. 4 illustrates a methodology for making a TSV structure configured in accordance with an embodiment of the present disclosure.

FIG. 4 illustrates a methodology 400 for making an integrated circuit configured in accordance with an embodiment of the present disclosure. Reference may be made to the example structures shown in FIGS. 2 and 3 to further understanding. The method includes providing 402 a semiconductor substrate and forming 404 a through-silicon via (TSV) through the substrate. In some embodiments, the method 400 includes depositing 406 a landing pad adjacent to one end of the TSV. In other embodiments, the landing pad may not be needed. The method 400 continues by alternately depositing 408 each of a plurality of first insulation layers and a plurality of second insulation layers between the substrate and the TSV, thereby forming a liner for electrically insulating the TSV from the substrate. The first insulation layers have an inherent tensile stress and the second insulation layers have an inherent compressive stress. In some embodiments, one of the first insulation layers is deposited adjacent to the substrate and one of the second insulation layers is deposited adjacent to the TSV. In some embodiments, each of the first insulation layers is deposited using a thermal oxidation process. In some embodiments, each of the second insulation layers is deposited using a plasma enhanced chemical vapor deposition (PECVD) process. In some embodiments, all of the first insulation layers have substantially the same thickness. In some other embodiments, all of the second insulation layers have substantially the same thickness. In yet some other embodiments, all of the first and second insulation layers have substantially the same thickness.

Note that the forming process may be taken in any number of sequences, and the depiction in FIG. 4 is not intended to implicate a specific order of processing steps. Rather, numerous such methodologies will be apparent in light of this disclosure.

System

Figure 5:
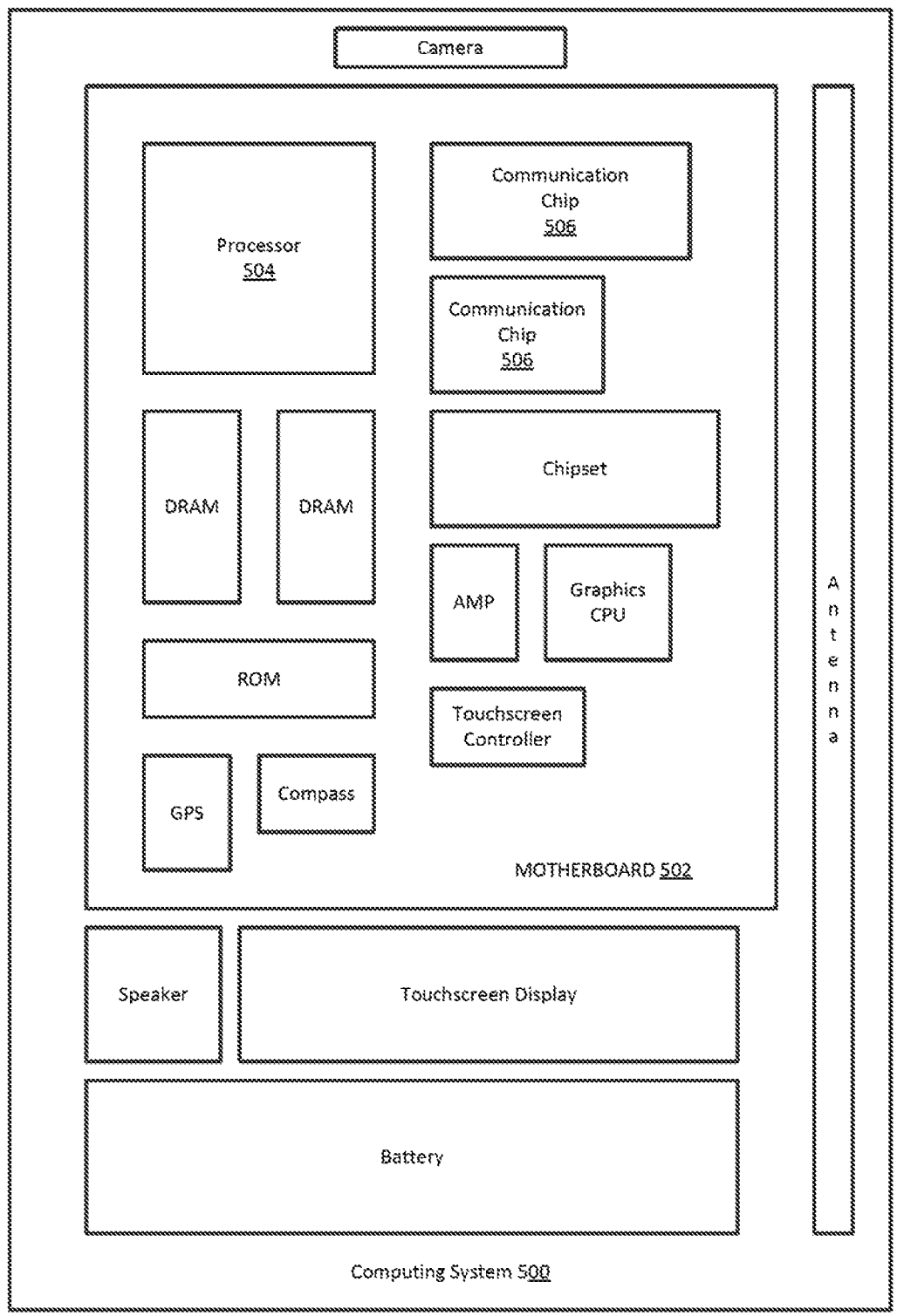
FIG. 5 illustrates a computing system implemented with a TSV structure configured in accordance with an embodiment of the present disclosure.

FIG. 5 illustrates a computing system implemented with an integrated circuit configured in accordance with an embodiment of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board, whether a main board, a daughterboard mounted on a main board, or the only board of system 500, etc. Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices formed using the techniques disclosed herein. In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more integrated circuit structures or devices as described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing device 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices, as variously described herein.

Further Example Embodiments

The following examples pertain to further embodiments, from which numerous permutations and configurations will be apparent.

Example 1 is an integrated circuit, comprising: a semiconductor structure; a through-body via extending through at least a part of the semiconductor structure; and a liner disposed between the substrate and the through-body via, the liner including a plurality of first insulation layers alternating with a plurality of second insulation layers different from the first insulation layers.

Example 2 includes the subject matter of Example 1, where at least one of the first insulation layers has an inherent tensile stress and at least one of the second insulation layers has an inherent compressive stress.

Example 3 includes the subject matter of any of the previous examples, where one of the first insulation layers is disposed adjacent to the semiconductor structure, and where one of the second insulation layers is disposed adjacent to the through-body via.

Example 4 includes the subject matter of any of the previous examples, where each of the first insulation layers includes a dielectric film.

Example 5 includes the subject matter of any of the previous examples, where each of the first or second insulation layers includes a thermal oxide film, such as a dielectric film.

Example 6 includes the subject matter of any of the previous examples, where each of the first or second insulation layers includes a plasma enhanced chemical vapor deposition (PECVD) film, such as a dielectric film.

Example 7 includes the subject matter of any of the previous examples, where each of the first and/or second insulating layers includes at least one of silicon oxide, silicon nitride, silicon carbide, carbon doped oxide (CDO), oxide doped carbide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide.

Example 8 includes the subject matter of any of the previous examples, where all of the first insulation layers have substantially the same thickness.

Example 9 includes the subject matter of any of the previous examples, where all of the second insulation layers have substantially the same thickness.

Example 10 includes the subject matter of any of the previous examples, where all of the first and second insulation layers have substantially the same thickness.

Example 11 includes the subject matter of any of the previous examples, further comprising a landing pad disposed adjacent to one end of the through-body via, where a portion of the liner abuts the landing pad.

Example 12 is a three-dimensional system-in-package device comprising an integrated circuit of any of the previous examples.

Example 13 includes the subject matter of any of the previous examples, where the semiconductor structure includes silicon and the through-body via is a through-silicon via (TSV).

Example 14 is a method of making an integrated circuit, comprising: providing a semiconductor structure; forming a through-body via through at least part of the semiconductor structure; and alternately depositing each of a plurality of first insulation layers and a plurality of second insulation layers between the semiconductor structure and the through-body via, thereby forming a liner, the second insulation layers being different from the first insulation layers.

Example 15 includes the subject matter of Example 14, where the first insulation layers have an inherent tensile stress and the second insulation layers have an inherent compressive stress.

Example 16 includes the subject matter of any of Examples 14-15, further comprising modulating the depositing of each of the first insulation layers to have a tensile stress and modulating the depositing of each of the second insulation layers to have a compressive stress.

Example 17 includes the subject matter of any of Examples 14-16, further comprising depositing one of the first insulation layers adjacent to the semiconductor structure and depositing one of the second insulation layers adjacent to the through-body via.

Example 18 includes the subject matter of any of Examples 14-17, further comprising depositing each of the first or second insulation layers using a thermal oxidation process.

Example 19 includes the subject matter of any of Examples 14-18, further comprising depositing each of the first or second insulation layers using a plasma enhanced chemical vapor deposition (PECVD) process.

Example 20 includes the subject matter of any of Examples 14-19, further comprising depositing all of the first insulation layers with substantially the same thickness.

Example 21 includes the subject matter of any of Examples 14-20, further comprising depositing all of the second insulation layers with substantially the same thickness.

Example 22 includes the subject matter of any of Examples 14-21, further comprising depositing all of the first and second insulation layers with substantially the same thickness.

Example 23 includes the subject matter of any of Examples 14-22, further comprising disposing a landing pad adjacent to one end of the through-body via such that a portion of the liner abuts the landing pad.

Example 24 includes the subject matter of any of Examples 14-23, where the semiconductor structure includes silicon and the through-body via is a through-silicon via (TSV).

Example 25 includes the subject matter of Examples 14-24, where each of the first insulation layers includes at least one of silicon oxide, silicon nitride, silicon carbide, carbon doped oxide (CDO), oxide doped carbide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide; and where each of the second insulation layers includes at least one of silicon oxide, silicon nitride, silicon carbide, carbon doped oxide (CDO), oxide doped carbide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide.

Example 26 is an integrated circuit, comprising: a semiconductor structure; a through-body via extending through at least a part of the semiconductor structure; and a liner for electrically insulating the through-body via from the substrate, the liner having a plurality of alternating insulation layers of different materials.

Example 27 includes the subject matter of Example 26, where the different materials have dissimilar inherent stresses.

Example 28 includes the subject matter of any of Examples 26-27, where at least one of the insulation layers has an inherent tensile stress and at least another one of the insulation layers has an inherent compressive stress.

Example 29 includes the subject matter of any of Examples 26-28, where one of the insulation layers is disposed adjacent to the semiconductor structure, and wherein another one of the insulation layers is disposed adjacent to the through-body via.

Example 30 includes the subject matter of any of Examples 26-29, where at least one of the insulation layers includes a thermal oxide film.

Example 31 includes the subject matter of any of Examples 26-30, where at least one of the insulation layers includes a plasma enhanced chemical vapor deposition (PECVD) oxide film.

Example 32 includes the subject matter of any of Examples 26-31, where at least two of the insulation layers have substantially the same thickness.

Example 33 includes the subject matter of any of Examples 26-32, where all of the insulation layers have substantially the same thickness.

Example 34 includes the subject matter of any of Examples 26-33, further comprising a landing pad disposed adjacent to one end of the through-body via, wherein a portion of the liner abuts the landing pad.

Example 35 includes the subject matter of any of Examples 26-34, where the semiconductor structure includes silicon and the through-body via is a through-silicon via (TSV).

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit, comprising:
a semiconductor structure;
a through-body via extending through at least part of the semiconductor structure; and
a liner disposed between the semiconductor structure and the through-body via, the liner including a plurality of first insulation layers alternating with a plurality of second insulation layers different from the first insulation layers.

2. The integrated circuit of claim 1, wherein at least one of the first insulation layers has an inherent tensile stress and at least one of the second insulation layers has an inherent compressive stress.

3. The integrated circuit of claim 1, wherein one of the first insulation layers is disposed adjacent to the semiconductor structure, and wherein one of the second insulation layers is disposed adjacent to the through-body via.

4. The integrated circuit of claim 1, wherein each of the first insulation layers includes a thermal dielectric film.

5. The integrated circuit of claim 1, wherein each of the first or second insulation layers includes a thermal oxide film.

6. The integrated circuit of claim 1, wherein each of the first or second insulation layers includes a plasma enhanced chemical vapor deposition (PECVD) dielectric film.

7. The integrated circuit of claim 1, wherein each of the first and/or second insulating layers includes at least one of silicon oxide, silicon nitride, silicon carbide, carbon doped oxide (CDO), oxide doped carbide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide.

8. The integrated circuit of claim 1, wherein all of the first insulation layers and/or all of the second insulation layers have substantially the same thickness.

9. The integrated circuit of claim 1, further comprising a landing pad disposed adjacent to one end of the through-body via, wherein a portion of the liner abuts the landing pad.

10. The integrated circuit of claim 1, wherein the semiconductor structure includes silicon and the through-body via is a through-silicon via (TSV).

11. A three-dimensional system-in-package device comprising an integrated circuit of claim 1.

12. A method of making an integrated circuit, comprising:
providing a semiconductor structure;
forming a through-body via through at least part of the semiconductor structure; and
alternately depositing each of a plurality of first insulation layers and a plurality of second insulation layers between the semiconductor structure and the through-body via, thereby forming a liner, the second insulation layers being different from the first insulation layers.

13. The method of claim 12, wherein at least one of the first insulation layers has an inherent tensile stress and at least one of the second insulation layers has an inherent compressive stress.

14. The method of claim 12, further comprising modulating the depositing of each of the first insulation layers to have a tensile stress and modulating the depositing of each of the second insulation layers to have a compressive stress.

15. The method of claim 12, further comprising depositing one of the first insulation layers adjacent to the semiconductor structure and depositing one of the second insulation layers adjacent to the through-body via.

16. The method of any claim 12, further comprising depositing each of the first insulation layers using a thermal oxidation process.

17. The method of claim 12, further comprising depositing each of the second insulation layers using a plasma enhanced chemical vapor deposition (PECVD) process.

18. The method of claim 12, further comprising depositing all of the first insulation layers and/or all of the second insulation layers with substantially the same thickness.

19. The method of claim 12, further comprising disposing a landing pad adjacent to one end of the through-body via such that a portion of the liner abuts the landing pad.

20. The method of claim 12, wherein the semiconductor structure includes silicon and the through-body via is a through-silicon via (TSV).

21. The method of claim 12:
wherein each of the first insulation layers includes at least one of silicon oxide, silicon nitride, silicon carbide, carbon doped oxide (CDO), oxide doped carbide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide; and
wherein each of the second insulation layers includes at least one of silicon oxide, silicon nitride, silicon carbide, carbon doped oxide (CDO), oxide doped carbide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide.

22. An integrated circuit, comprising:
a semiconductor structure;

a through-body via extending through at least part of the substrate; and a liner for electrically insulating the through-body via from the substrate, the liner having a plurality of alternating insulation layers of different materials.

23. The integrated circuit of claim 22, wherein the different materials have dissimilar inherent stresses.

24. The integrated circuit of claim 22, wherein at least one of the insulation layers has an inherent tensile stress and at least another one of the insulation layers has an inherent compressive stress.

25. The integrated circuit of claim 22, wherein one of the insulation layers is disposed adjacent to the semiconductor structure, and wherein another one of the insulation layers is disposed adjacent to the through-body via.

* * * * *